United States Patent
Reynders et al.

(10) Patent No.: US 7,804,670 B2
(45) Date of Patent: Sep. 28, 2010

(54) HYBRID ESD CLAMP

(75) Inventors: Koen Reynders, Oudenaarde (BE); Peter Moens, Zottegem (BE)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 558 days.

(21) Appl. No.: 11/794,472

(22) PCT Filed: Jan. 7, 2005

(86) PCT No.: PCT/BE2005/000003

§ 371 (c)(1),
(2), (4) Date: Jun. 29, 2007

(87) PCT Pub. No.: WO2006/072148

PCT Pub. Date: Jul. 13, 2006

(65) Prior Publication Data

US 2009/0268357 A1    Oct. 29, 2009

(51) Int. Cl.
    *H02H 3/22* (2006.01)
(52) U.S. Cl. .......................... 361/56; 361/111
(58) Field of Classification Search ............... 361/56, 361/111
    See application file for complete search history.

(56) References Cited

U.S. PATENT DOCUMENTS

| | | | |
|---|---|---|---|
| 4,630,162 A | 12/1986 | Bell et al. | |
| 5,528,188 A * | 6/1996 | Au et al. | 327/310 |
| 5,780,895 A * | 7/1998 | Barret et al. | 257/328 |
| 5,869,873 A * | 2/1999 | Yu | 257/362 |
| 5,917,220 A * | 6/1999 | Waggoner | 257/360 |
| 5,982,217 A | 11/1999 | Chen et al. | |
| 6,064,249 A | 5/2000 | Duvvury et al. | |
| 6,218,706 B1 | 4/2001 | Waggoner et al. | |
| 6,570,226 B1 | 5/2003 | Groeseneken et al. | |
| 6,693,339 B1 | 2/2004 | Khemka et al. | |
| 2001/0053054 A1 | 12/2001 | Andoh | |

(Continued)

FOREIGN PATENT DOCUMENTS

EP    1 058 308 A1    12/2000

OTHER PUBLICATIONS

M. Mergene et al., "Analysis of Lateral DMOS Power Devices Under ESD Stress Conditions", IEEE Transactions on Electron Devices, vol. 47, No. 11, Nov. 2000, pp. 2128-2137.

(Continued)

*Primary Examiner*—Danny Nguyen
(74) *Attorney, Agent, or Firm*—Bacon & Thomas, PLLC

(57) ABSTRACT

A circuit for protecting a semiconductor from electrostatic discharge events includes a Zener diode (21) in series with a resistor (22) between a power line HV VDD and a ground fine HV VSS. A gate of a DMOS device (23) is connected to a node between the diode and the resistor. The drain and source of the DMOS are connected between the power lines. During an ESD event, the gate voltage of the DMOS increases and the ESD current will be discharged through the DMOS to ground. When the current exceeds the capacity of the channel of the DMOS, a parasitic bipolar transistor or transistors associated with the DMOS device acts in a controlled snapback to discharge the current to ground. The use of a vertical DMOS (VDMOS) instead of a lateral DMOS (LDMOS), can reduce the area of the device and improve the protection.

27 Claims, 5 Drawing Sheets

U.S. PATENT DOCUMENTS

2004/0160717 A1* 8/2004 May et al. .................. 361/91.5

OTHER PUBLICATIONS

V. Parthasarathy et al., "A Double RESURF LDMOS With Drain Profile Engineering for Improved ESD Robustness", *IEEE Electron Device Letters*, vol. 23, Apr. 2002, pp. 212-214.

K. Reynders, et al., "Design and characterization of a Novel High Voltage Power Supply ESD protection", Submission of Presentation To 2005 IRPS during $4^{th}$ quarter of 2004, without known publication availability prior to IRPS Conference in Apr. 2005, pp. 1-3.

P. Moens et al., "I3T80:A 0.35 μm Based-on-Chip Technology for 42V Battery Automotive Applications", *Proceedings of the International Symposium on Power Semiconductor Devices*, (ISPSD), 2002, pp. 225-228.

P. Moens et al., "Effects of Hot Spot Hopping and Drain Ballasting in Integrated Vertical DMOS Device Under TLP Stress", *$42^{nd}$ Annual International Reliability Physics Symposium*, IRPS2004, Phoenix, pp. 393-398.

Communication of European Patent Office regarding European Application No. 05700212.3, Summons to Attend Oral Hearing, Sep. 12, 2008.

* cited by examiner

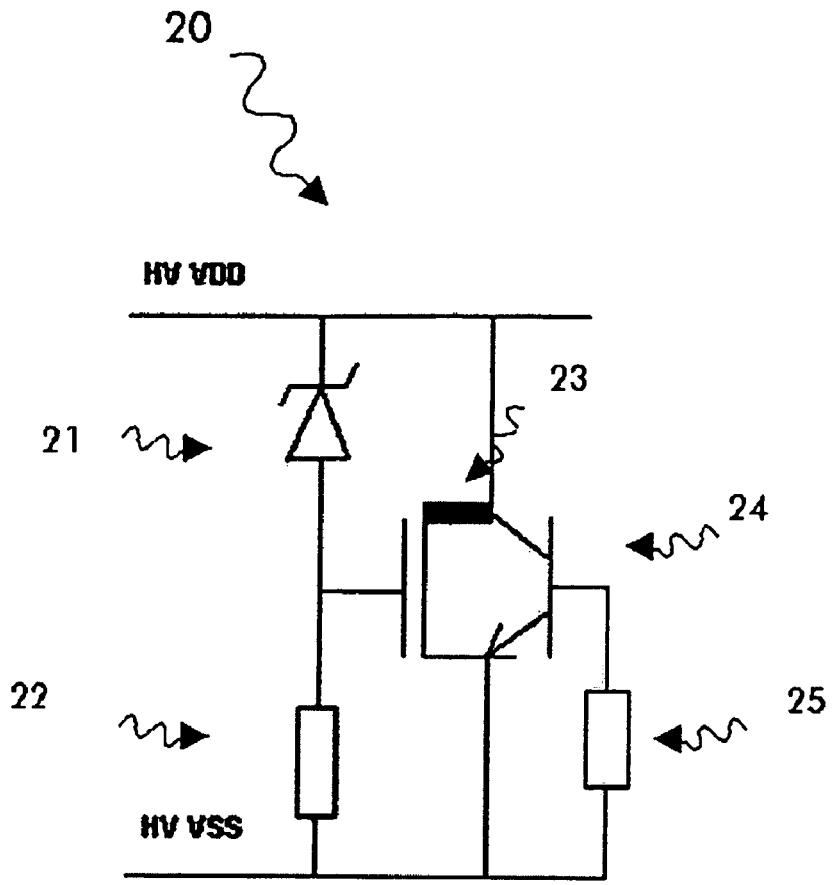
Figure 3. Hybrid Clamp
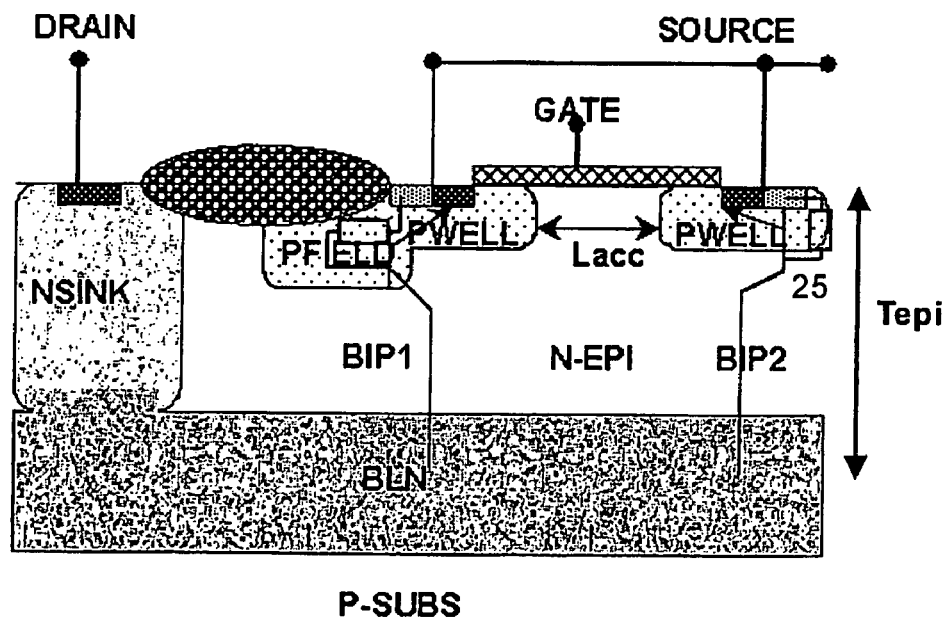
Figure 4. VDMOS

HYBRID ESD CLAMP

FIELD OF THE INVENTION

This invention relates generally to protection for semiconductor devices such as integrated circuits from transient overstress such as electrostatic discharge (ESD) and more specifically to a clamp circuit for the protection of a semiconductor device such as an integrated circuit from increased supply voltages caused by ESD.

DESCRIPTION OF THE RELATED ART

Integrated circuits are susceptible to ESD events that can either degrade the performances of those circuits or may destroy them. Hence ESD protection circuits are used. While essential to the survival of the chip, ESD protection circuitry does not play any role in the actual function(s) carried out by the silicon chip. Decreasing the size of the ESD protection circuitry while maintaining its performance would be desirable to increase integration or increase margins. Protection circuitry is also useful to guard against spikes on power supply lines. Classical snapback ESD protection circuitry with holding voltages below the supply voltage is risky because it can be triggered by spikes 14 present on the supply line 13 (in automotive applications for instance, the alternator introduces spikes on the supply line which might only be partially removed by external components in the application). This is represented in FIG. 1. Once the ESD snapback protection is triggered, it can discharge all the energy of the supply and at the same time destroy itself together with the circuit it is meant to protect.

A known circuit for voltage supply protection in high voltage applications is an active clamp, common in so called Smart Power chips. However they require large areas of silicon. Active clamps 10 are used as protection for power supplies 11 connected to a voltage source (represented in FIG. 1). Active clamps 10 are more suitable for handling spikes 14 present on the supply line 13 since when triggered, it will not go into snapback unless the discharge current exceeds several amperes. Spikes on the power supply are in general not so energetic that the discharge current will reach those levels. Parts 12A and 12B are the supply pins to external, i.e. outside the chip. ESD clamps reported in the prior art as in U.S. Pat. Nos. 6,218,706 and 4,630,162 rely on the action of a bipolar transistor that is an intrinsic part of a MOS structure. Their application is limited to LV (Low Voltage) CMOS. A large number of techniques have been developed to make this bipolar transistor robust for ESD by means of silicide blocked drain and source extensions, nldd blocking or other types of techniques which aim to add collector ballasting to achieve homogeneous turn-on during an ESD event. Active clamps as reported in U.S. Pat. No. 6,064,249 use a lateral DMOS (Double diffused MOS) to handle the ESD current in active mode. This means that the entire ESD current has to be conducted in saturation. Lateral DMOS devices (LDMOS) have saturation currents well below 1 mA/µm. As a consequence this type of Active clamp occupies a large area of silicon to achieve the desired robustness for ESD events with currents up to 3 A. This is a major disadvantage of this type of ESD clamp. In typical state of the art high voltage technologies, an active clamp able to deal with discharge currents up to 3 A will occupy 0.15 mm² of silicon.

The intrinsic bipolar transistor of a lateral DMOS device is in general too weak to conduct the ESD current. As a consequence the lateral DMOS device cannot be sent into snapback. Snapback is the activation of the intrinsic bipolar transistor by a base current that is generated by impact ionisation. For a high voltage lateral DMOS (voltages significant above the CMOS operating voltage range) this turn-on results in a steep voltage drop. This voltage drop tends to focus the current into narrow current filaments with very high current density underneath the silicon surface. This effect can cause rapid destruction of the component.

It is known that adding a partially recessed) BLN (Buried Layer N type doping) and N-sinkers will improve the robustness/ruggedness of lateral DMOS devices, as shown in the following:

[1] M. P. J Mergens et al., "Analysis of Lateral DMOS Power Devices under ESD Stress Conditions", IEEE Transactions on Electron Devices, 47, (2000), pp 2128-2137

[2] V. Parthasarathy et al., "A double Resurf LDMOS with Drain Profile Engineering for Improved ESD Robustness", IEEE Electron Device Letters, 23, (2002), pp 212-214

[3] U.S. Pat. No. 6,693,339 "Semiconductor Component and Method of Manufacturing the Same", Khemka et al, Feb. 17, 2004.

Under normal operating conditions the current still flows laterally, but in snapback the vertical bipolar is activated, pulling the current away from the birds beak tip. Hence the ESD current capability is increased (up to 15-20 mA/µm [2]). In [3] a deep drain device is proposed. The value of the current at hard failure for the deep drain device is 60% higher than for the shallow drain case. The measured holding voltage and second breakdown voltage for the deep drain device are 20V and 19V, compared to 6V and 8V respectively in the shallow drain structure. Hence, the difference in maximum ESD power between the two structures is even more pronounced than the difference in current at hard failure. There remains a need for more effective devices.

SUMMARY OF THE INVENTION

An object of the invention is to provide improved protection for semiconductor devices such as integrated circuits from transient overstress such as electrostatic discharge (ESD) and more specifically to a clamp circuit for the protection of a semiconductor device such as an integrated circuit from increased supply voltages caused by ESD, as well as methods of operating any of the same. An advantage of the present invention is that the clamp circuit is not restricted to protecting supply pins but can be used to protect other components of semiconductor device such as HV Input/output pins against ESD.

According to a first aspect, the invention provides:

A circuit having a Gate Driven Power Transistor Device coupled to protect a line subject to transient overstress, and the circuit having external circuitry coupled to the transistor device to provide an active clamp mode in which the gate of the transistor device is controlled to allow transient overstress current from the line through the transistor device, and the transistor device having a snapback mode in which one or more transistors conduct the current if the transient overstress exceeds a predetermined threshold. The one or more transistors for conducting the current in transient overstress may include at least one parasitic transistors. Where the Gate Driven Power Transistor Device does not have a suitable intrinsic parasitic transistor such a transistor may be fabricated into the Gate Driven Power Transistor Device. The transistor device may be a high voltage transistor device, e.g. those made in MOS technology, such as DMOS, for example.

The above circuit involves a combination of two techniques previously known as alternatives, the snapback and active clamp techniques. The combination can overcome some of the disadvantages of each. A smaller chip area is possible compared to active clamping alone. Smaller transients can be caught more reliably compared to snapback alone. Hence performance for a given area, or area for a given performance can be improved. This is particularly useful for high voltage devices, and for various types of transient overstress.

An additional feature for a dependent claim is the transistor device being a vertical transistor such as a vertical DMOS transistor. A vertical DMOS intrinsically contains a vertical bipolar transistor. An active clamp circuit with a vertical DMOS transistor will therefore be intrinsically more robust for ESD on the one hand but the total area needed to conduct ESD currents in saturation mode is larger compared to lateral DMOS transistor active clamps due to a larger drain overhead.

Another additional feature is the one or more transistors, e.g. parasitic transistors for conducting the current during transient overstress may be bipolar transistors. Another additional feature is the transistor device being a transistor provided with two or more source regions. This can enable two parasitic transistors and can spread the current in the snapback mode and so increase the capacity.

Another additional feature is the external circuitry comprising a voltage limiting device such as a Zener diode or Zener diode string or high voltage avalanche diode coupled between the gate and a supply line, and a resistor coupled between the gate and a supply line. This arrangement can enable the active clamping with few components, to use little chip area. Other external circuitry arrangements can be used. Another additional feature is the threshold being set below a current capacity of a channel of the transistor device.

Another additional feature is a distance between source regions (Lacc) of a transistor forming the transistor device being selected to provide the desired threshold.

Another additional feature is a width (W) of the transistor device being set to provide the desired threshold. The width of the transistor device is the total effective width of the channel, e.g. an MOS channel, which is part of a transistor device such as a DMOS device.

Another additional feature is a depth of a drain region (Tepi) below the gate being selected to provide the desired threshold.

Another additional feature is the transistor having a highly doped buried layer (BLN).

This can increase robustness to overstress currents

Another additional feature is an optimized resistivity of the buried layer to reach an optimal balance between hot spot hopping and drain ballasting which leads to an enhanced current carrying capacity.

Another additional feature is the transistor device comprising a transistor of a first type and a second transistor of opposite type coupled in a thyristor configuration. This can act as a thyristor to provide conduction with less energy dissipated in this structure than for the first transistor such as a vertical npn bipolar transistor alone at the same current level. As a consequence this structure can handle higher overstress current levels.

Other aspects of the invention include methods of manufacturing such circuits, and integrated circuits comprising the above circuits.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which:

FIG. 3 shows a schematic view of a hybrid clamp according to an embodiment of the invention, FIG. 4 shows a cross section of a VDMOS.

DESCRIPTION OF THE PREFERRED EMBODIMENTS

Figure 1:
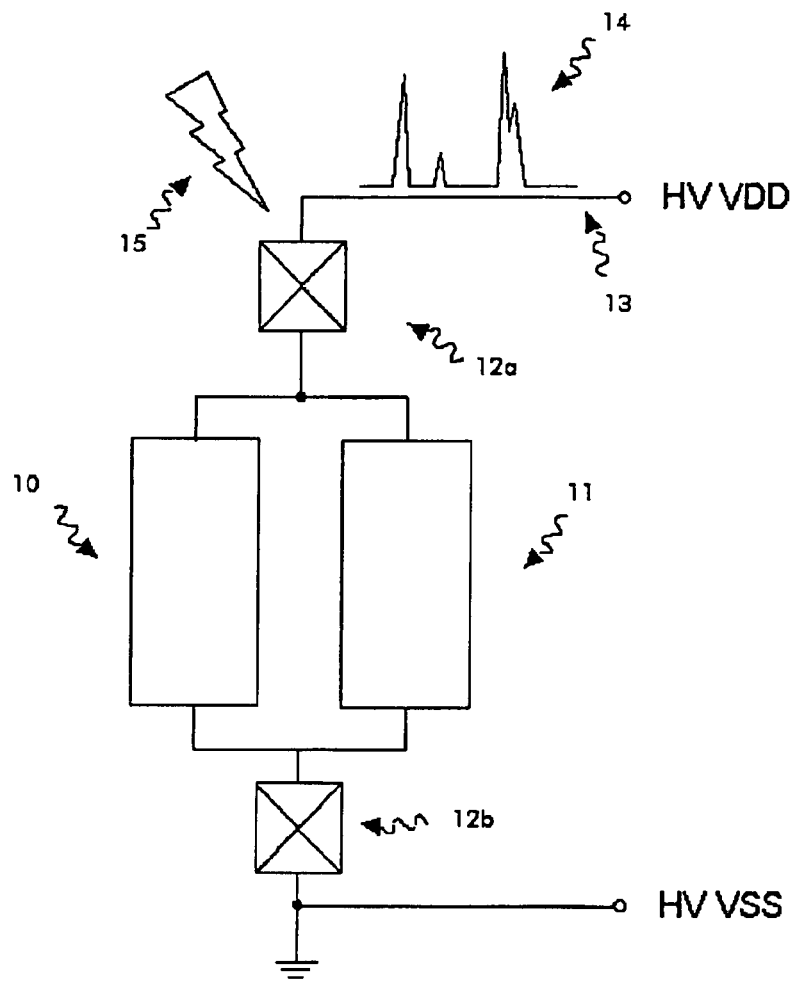
FIG. 1 shows a schematic view of the problem.

The present invention will be described with respect to particular embodiments and with reference to certain drawings but the invention is not limited thereto but only by the claims. Any reference signs in the claims shall not be construed as limiting the scope of the invention. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein. Moreover, it is to be understood that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B. Where an indefinite or definite article is used when referring to a singular noun e.g. "a" or "an", "the", this includes a plural of that noun unless something else is specifically stated.

Figure 2:
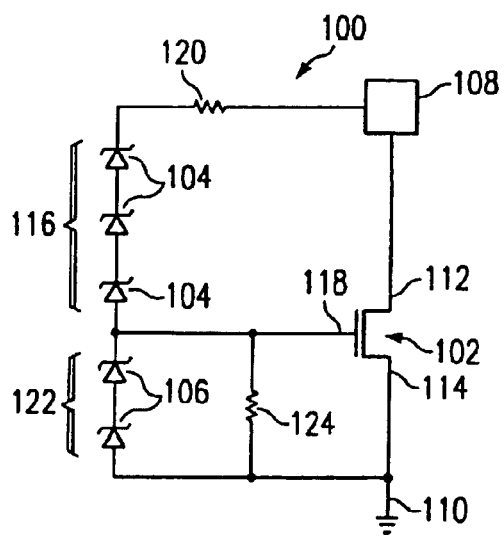
FIG. 2 shows an active clamp using a LDMOS known from U.S. Pat. No. 6,064,249.

A known arrangement, shown in U.S. Pat. No. 6,064,249 will be described with reference to FIG. 2. An output circuit 100 has a LDMOS transistor 102 and Zener clamps (104-106). The drain 112 of LDMOS transistor 102 is connected to the output pad 108 and the source 114 of LDMOS transistor 102 is connected to a source potential 110 (typically ground). A drain clamp 116, consisting of one or more Zener diodes 104, is connected between drain 112 and the gate 118 of LDMOS transistor 102. A first resistor 120 may be connected between the drain 112 and the drain clamp 116. First resistor 120 is a relatively small resistor (e.g. about 100 ohms). Its purpose is to slow down the charging of gate 118 to ensure that the LDMOS uniformly turns-on. This becomes important when a multi-fingered layout is used to form LDMOS 102. A gate clamp 122, consisting or one or more Zener diodes 106, is connected between the gate 118 and the source potential 110. A second resistor 124 may be connected between the gate 118 and source potential 110. Resistor 124 is a relatively large resistor (e.g. on the order of 10 k-ohms) and its purpose is discharge the gate 118 after an initial ESD pulse so that the protected circuit can continue normal operation.

Figure 5:
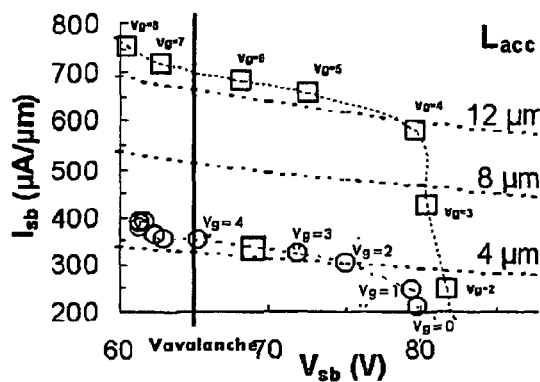
FIG. 5 shows a graph of influence of Lacc on the snapback voltage and current of a VDMOS.

FIGS. 3, 4, 5 First Embodiment

A first embodiment of the invention, illustrated in FIG. 3 is a hybrid clamp and has two modes of operation:

Active clamp mode

Snapback mode especially controlled snapback mode

The circuit for protecting a line such as a semiconductor power supply line from increased supply line voltages due to electrostatic discharge events or other transient overstress comprises a voltage limiting device such as a Zener diode or diode string 21 (or high voltage avalanche diode) in series with a resistor 22 between a power line HV VDD or an IO pin and a ground line HV VSS or an IO pin. The present invention is not restricted to supply lines. Supply lines are only mentioned as an example. The invention can also have advantageous use as high voltage Input/Output protection. A control electrode, e.g. gate of a Gate Driven Power Transistor Device such as a DMOS device 24 is connected to a node between the voltage limiting device, e.g. Zener Diode and the resistor. Optionally additional gate protection can be provided by a voltage limiting device such as a Zener diode between the gate and the source. One major power electrode, e.g. the drain of the DMOS transistor is connected to the power line and its other main electrode, e.g. source, to the ground line. During an ESD event, the gate voltage of the DMOS will increase and the ESD current will be discharged through the DMOS to ground. When the amplitude of the discharge current becomes incompatible with the current carrying capacities of the channel of the DMOS, the parasitic bipolar transistor or transistors associated with the DMOS device are used in a controlled snapback to discharge the current to ground. If the Gate Driven Power Transistor Device does not contain suitable intrinsic parasitic transistors, these can be fabricated with the Gate Driven Power Transistor Device. Suitable transistors are bipolar transistors.

The use of a vertical DMOS (VDMOS) instead of a lateral DMOS (LDMOS), can reduce the area of the device and improve the protection. The use of a vertical DMOS device over a lateral DMOS device has the advantage that the VDMOS device always has an intrinsic vertical bipolar transistor. The VDMOS device is hence by nature more robust against electrical overstress.

For the low discharge current range, the current is conducted through the channel of the DMOS 23. The DMOS is sized to handle a specified current in saturation before it goes into snapback. The gate to source voltage is determined by the voltage limiting device, e.g. Zener diode string or high voltage avalanche diode 21 and the resistor 22. For a higher discharge current, the parasitic bipolar transistor 24 associated with the DMOS when the latter goes into snapback, conducts the discharge current. The parasitic transistor has an associated parasitic base resistance 25 to the source of the DMOS or to ground.

FIG. 4 shows the cross section of an example of a VDMOS in accordance with an embodiment of the present invention, with overlaid symbols to indicate parasitic bipolar transistors. The figure shows drain, gate and source contacts and regions. A typical vertical DMOS transistor is integrated for example in a 0.35 µm based smart power technology. The gate oxide thickness is 7.0 nm, limiting the maximum gate voltage under normal operating conditions to 3.3 V. The device uses the standard 0.35 µm CMOS p-well as a channel, yielding a threshold voltage $V_t$ of 0.6V. The drain of the transistor consists of a lowly doped n-epi and a highly doped BLN and n-sinker. In this way, the current can be collected at the silicon surface. The off-state breakdown voltage $V_{bd}$ is 85V. The specific on-resistance (Ron) is 0.16 $\Omega*mm^2$ (measured at $V_{gs}$=3.3V, $V_{ds}$=0.5V). A substrate P_SUBS is shown. A more complete overview of the process flow and the definition of the different layers, is given in P. Moens et al., "I3T80: A 0.35 mm Based System-on-Chip Technology for 42V Battery Automotive Applications", Proceedings of the International Symposium on Power Semiconductor Devices (ISPSD), 2002, pp 225-228. As the device has two sources in the form of PWELL regions, two intrinsic vertical bipolar transistors are present, separated only 10 µm apart. They are labeled BIP1 (closest to the nsinker) and BIP2.

The voltage at which the VDMOS will go into snapback is tailored by means of distance parameter Lacc (FIG. 4). Lacc is the distance between two neighbouring (pwell) bulk regions. This distance has an influence on what is called quasi-saturation in a vertical DMOS. If this distance has too small a value, the drain region between the two wells has such a high electron density that the electron mobility is decreased for high gate and drain voltages. This creates an electrical field underneath this region towards the BLN. This leads to quasi-saturation: the $I_{ds\ vs.\ Vds}$ characteristics for high $V_{gs}$ doesn't show the normal transition from linear to saturation region for increasing $V_{ds}$, but the current keeps on increasing gradually until snapback. Lacc also determines the current density in the N-EPI layer. A smaller Lacc leads to a higher current density for a certain drain and gate voltage. When the current density reaches a critical value (determined by the doping level of the epi-layer), the so-called Kirk-effect pushes the region of maximum electrical field to the N-type buried layer (BLN). This results in a sudden increase of the impact ionisation rate. The hole current generated by the impact ionisation turns on the intrinsic bipolar transistors. Hence for higher Lacc values, the bipolar transistor turn-on takes place at higher drain voltages.

Another process related parameter that has an influence on the snapback point, is the thickness of the N-EPI layer. For thicker N-EPI layers, the region of maximum electrical field reaches the buried layer for higher drain voltages. The reason for this is that the Kirk-effect has to push the electrical field deeper before it reaches the BLN. VDMOS (vertical DMOS) are believed to be more robust against ESD pulses as the current and heat are distributed across a larger volume of silicon. The performance of a hybrid clamp using a VDMOS is expected to be better than those of a hybrid clamp making use of an LDMOS, though either could be used. VDMOS devices are less cost-effective to integrate as they require the processing of a highly doped n-type buried layer (BLN) as well as an n-type sinker to contact the BLN and to collect the current at the silicon surface. However, VDMOS transistors have the advantage that the current path is mainly in the silicon, away from the Si/SiO2 interface. As such, they have a superior hot carrier reliability compared to lateral DMOS devices. The voltage at which they will go into snapback can be tailored by choosing Lacc appropriately.

FIG. 5 shows a graph of $I_{sb}$ vs $V_{sb}$ to show the snapback voltage and current of a VDMOS device for a number of different values of Lacc, and for various values of $V_g$. The vertical line indicates the trigger voltage of the avalanche diode. The snapback point is located in the region right of this line because for the drain voltage of the active clamp the following equation is valid:

$$Vds = Vaval + Vgs \qquad (1)$$

Figure 6:
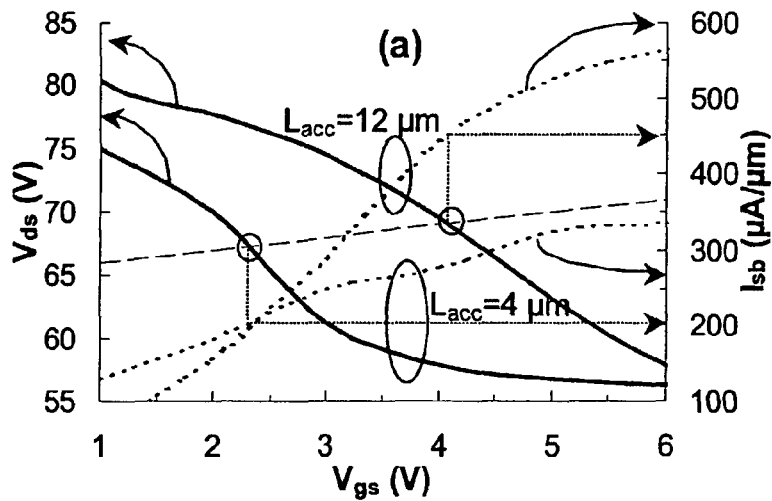
FIGS. 6 and 7 show graphs used for determining optimal Lacc parameter.
Figure 7:
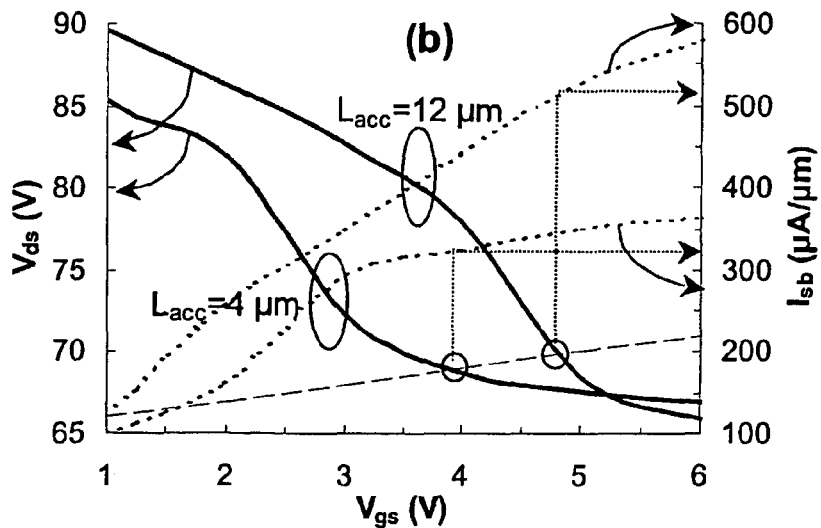

FIGS. 6 and 7 Selection of Optimum Lacc

FIGS. 6 and 7 show a technique to select the optimum Lacc parameter based on measurements. The solid curves indicate the snapback voltages as function of Vgs (left axis). The short dashed curves indicate the snapback current levels as function of Vgs (right axis). The long dashed line indicates the drain voltage imposed by the active clamp trigger circuit (see eq 1.). The intersection of the long dashed line with a solid curve gives the snapback voltage (Vds) and gate voltage (Vgs) of a hybrid clamp with that particular parameter Lacc. The snapback current is the Isb value for this gate voltage (Vgs). FIGS. 6 and 7 indicate these points with small circles for the different LACC and Tepi parameters. The snapback voltage is shown on the left Y axis. The corresponding points on the short dashed curves (snapback current level) are indicated by means of vertical dotted lines. The corresponding snapback current level is indicated by the dotted arrows on the right Y axis. To ensure a certain snapback current level (It1) for (transient) latch-up immunity, the device has to be scaled for this: Wclamp=It1/Isb. By comparing the required area for the different Lacc values, an area optimised hybrid clamp can be designed. FIGS. 6 and 7 give the snapback current and voltages for VDMOS structures with 2 different Lacc values, 4 and 12 μm. FIG. 6 contains data for a VDMOS with Tepi=7.4 μm. FIG. 7 contains data for a VDMOS with Tepi=8 μm. Comparison of these two figures clearly indicates that for a fixed gate voltage Vgs the snapback voltage shifts to higher values for increasing N-EPI layer thickness.

This physical effect offers the opportunity to choose Lacc minimal and optimise Tepi until the desired snapback point is reached: the gate voltage that can be reached before the hybrid clamp goes into snapback, increases with Tepi. As a consequence the snapback voltage and current increase. The required width of the hybrid clamp Wclamp=It1/Isb therefore decreases with increasing Tepi. Hence chip area can be reduced. Graphs like FIGS. 6 and 7 can be used to select an optimal Tepi if the process conditions are not fixed yet during the manufacturing in integrated circuit form of this circuit with other circuit elements.

Figure 8:
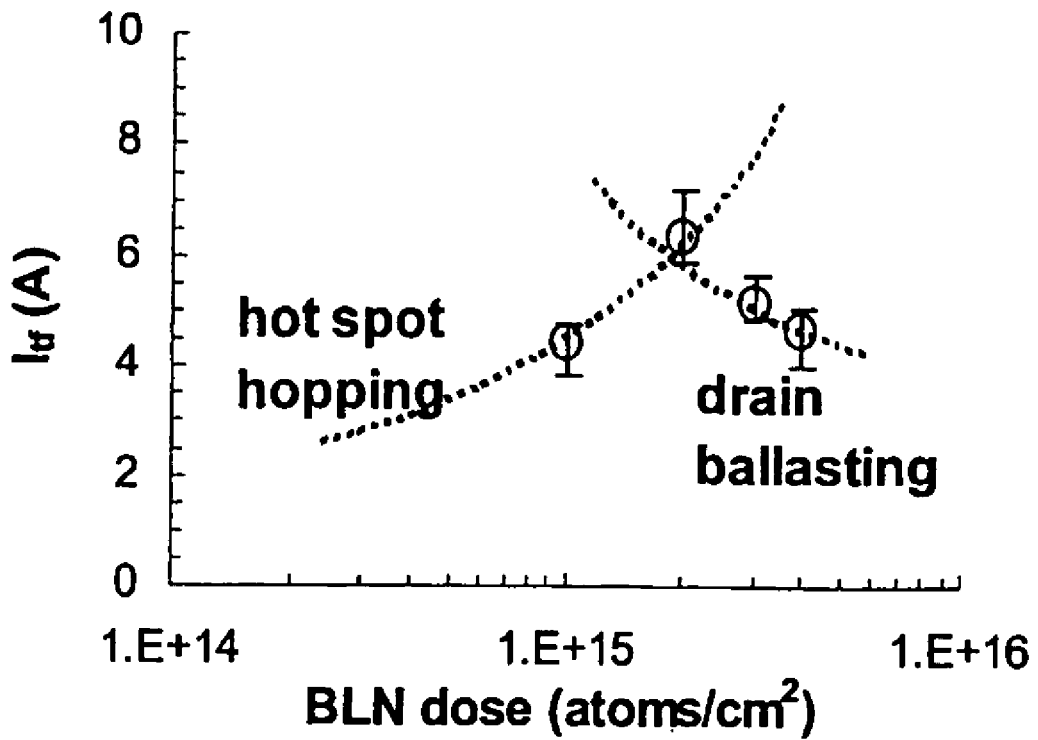
FIG. 8 shows a graph indicating an influence of hot spot hopping and drain ballasting on the failure current level.
Figure 9:
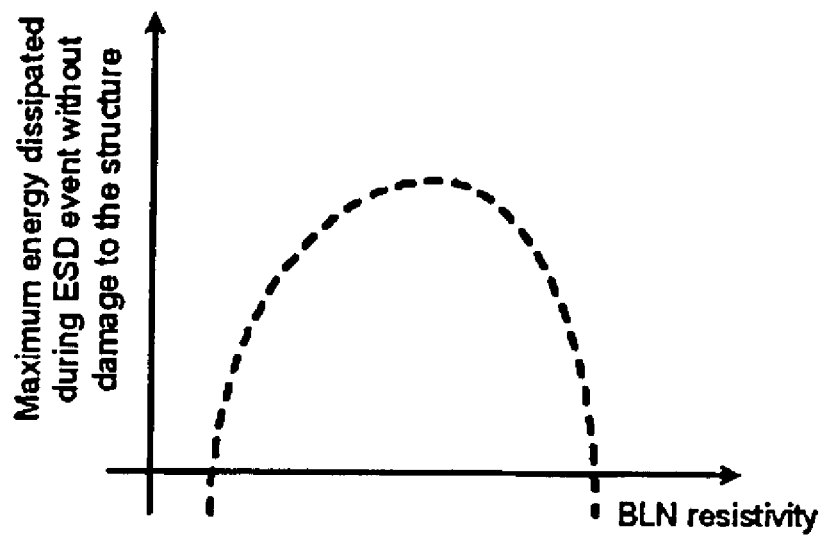
FIG. 9 shows ESD robustness as function of the BLN resistivity.

FIGS. 8, 9, BLN Dose

When the DMOS goes into bipolar snapback, the vertical source/pwell/BLN-N-sinker NPN bipolar transistor BIP1 is activated. When the duration of the discharge is short, only BIP1 is activated, when the discharge continues, the second bipolar BIP2 is activated and in some cases it seems to take over. Experiments show an activity shifting from BIP1 to BIP2 and back at frequencies in the tens of MHz range. P. Moens et al., "Effects of Hot Spot Hopping and Drain Ballasting in Integrated Vertical DMOS Devices under TLP Stress", IRPS2004, pp 393-398. [4]

Besides the hopping of the hot spot between BIP1 and BIP2, experiments show that several different current filaments are propagating along the device width W [4]. During snapback, heat is originally generated in the centre of the device. The discharge splits then in two filaments that travel back and forth (at speeds between 300 and 500 m/s towards each other and collide again in the centre of the device [4]). A consequence of hopping is that the total heat is distributed dynamically between BIP1 and BIP2, reducing the local maximum temperature. Experiments show that varying the BLN dose has a large effect on the hopping process: the VDMOS behaviour and thermal failure current are largely dependent on the BLN dose (also see [4]).

For low BLN dose, both intrinsic bipolar transistors BIP1 and BIP2 remain active throughout the entire discharge. As a consequence, the hot spot for BIP1 and BIP2 never completely vanishes and the time averaged lattice temperature is elevated. The physical origin of hot spot hopping is the reduction in impact ionisation of e.g. BIP1 due to lattice heating. If this reduction is sufficient enough, the impact ionisation spot will move outside the hot spot (where it is cooler and hence the impact ionisation coefficients are higher) to maintain itself. The hot spot will move towards BIP2 and BIP2 will get activated, taking over (some) bipolar activity. This process keeps repeating itself (hence the name hot spot hopping).

Another effect works along the width of the device: drain ballasting will render a larger part of the width of the device active during the ESD event and hence increase the current carrying capacity of the device. A low BLN dose is beneficial for drain ballasting.

For a high BLN dose, the hopping becomes more pronounced. For a sufficiently high BLN dose, the bipolar activity is completely transferred to one of the bipolar transistors BIP1 or BIP2. All current is hopping very efficient from 1 bipolar to another. It is supposed that due to filament hopping the thermal failure current should increase with increasing BLN dose. But the drain ballasting effect along the width of the device will decrease for increasing BLN dose. The hot spot hopping and the drain ballasting effects compete with each other as a function of the BLN dose (FIG. 8). FIG. 8 shows a graph of thermal failure current $L_{tf}$ with BLN dose in terms of atoms per $cm^2$ This explains the existence of an optimum value for the BLN dose where a protection of given dimensions will be able to withstand the highest energy dissipation during and ESD event without degradation of the structure, as illustrated in FIG. 9, if all other parameters are kept equal. (See [4]). Experimental data suggests that the BLN dose at which the optimum occurs is around $2 \cdot 10^{15}$ atoms/$cm^2$ [4] depending on the conditions.

Figure 10:
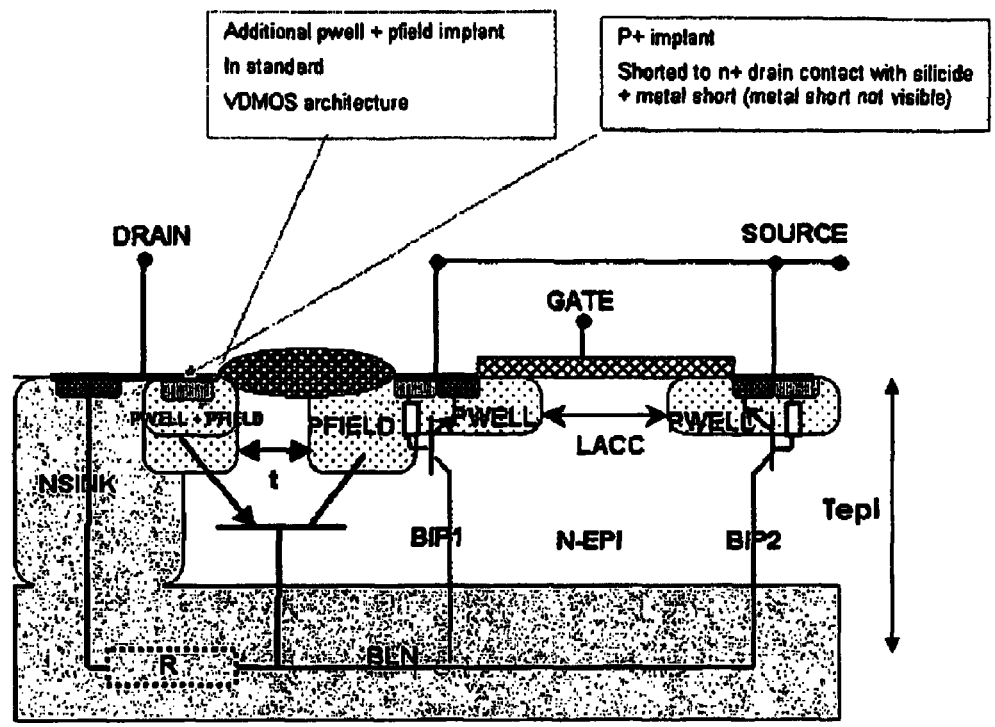
FIG. 10 shows a cross section of a VDMOS with a parasitic PNP transistor, according to another embodiment.
Figure 11:
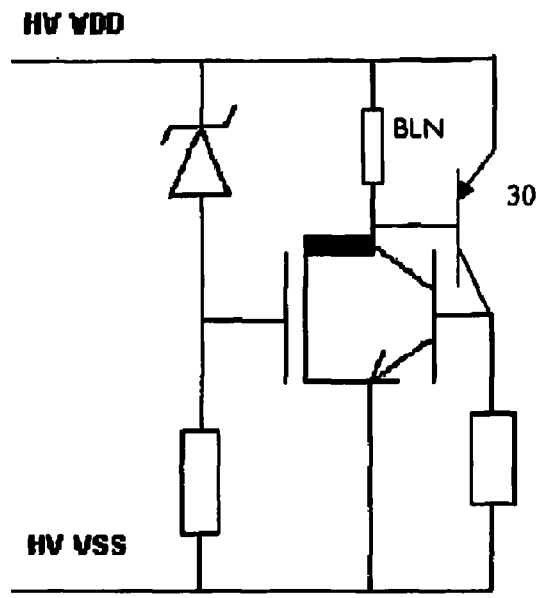
FIG. 11 shows a schematic view of a hybrid clamp with a thyristor according to another embodiment.

FIGS. 10 and 11, Embodiment with Additional Lateral PNP Transistor

As shown in FIGS. 10 and 11, with the integration of an additional p-type region in the form of a PWELL and a pfield implant in the VDMOS structure, an additional lateral PNP transistor can be created in accordance with an embodiment of the present invention. The pfield implant is shorted to the drain contact of the VDMOS with for example a silicide+ metal short. The parameter t shown in FIG. 10 as a separation distance of the additional p-type region from the bulk junction termination (pfield) region of the VDMOS, is chosen large enough that the off-state VBD (breakdown voltage) of the component is not changed. But it should not be so large that the PNP efficiency becomes too low.

As can be seen in the schematic view of FIG. 11, the structure now contains a vertical npn bipolar transistor and a lateral pnp transistor 30. The BLN layer is represented as a resistor coupling the npn transistor collector to HV VDD. Other parts are similar to FIG. 3. The pnp transistor is coupled so that a base is coupled to a collector of the npn transistor. A collector of the pnp is coupled to a base of the npn. An emitter of the pnp is coupled to HV VDD. This is a thyristor type configuration. If the product of the β's of these transistors is >1, then they form a latch-up structure that can be used to handle the ESD current. An advantage of this structure over the previous one is that the snapback voltage is now roughly equal to 2 (forward biased) diode voltage drops, so the energy dissipated in this new structure is lower than for the vertical npn bipolar transistor alone at the same current level. As a consequence this structure can handle higher destructive current levels. Even if this configuration doesn't go completely into the latch condition described above due to the fact that the pnp is not efficient enough, the current conducted by the pnp helps to turn the vertical npn on more homogeneously. The presence of the pnp is beneficial for the current capability of the VDMOS in snapback.

As before, the low discharge currents will be handled by the DMOS, the high discharge current will be handled in a latch-up mode by the thyristor structure. This will avoid false latching below the supply voltage: During an ESD event, when the voltage on the drain of the VDMOS exceeds the voltage breakdown of the avalanche/Zener diode, the gate of the VDMOS is biased and the DMOS turns on, discharging the ESD current. The current flows vertically and is collected by the BLN and conducted to the drain contact via the BLN layer and the sinker.

When a critical vertical current density is reached, the region with the maximum electrical field pushed towards the BLN due to an effect called "Kirk-effect". Due to the fact the BLN is highly doped, the electrical field increases drastically at the BLN on the place where the current density is the highest. As a consequence the impact ionisation increases rapidly. Generated holes are collected by the source/bulk contact (bulk and source are shorted via silicidation). Due to the intrinsic resistance of the pwell, the source bulk junctions locally become forward biased and the vertical NPN bipolar turns on. The current level at which this takes place, depends on the parameters Lacc and Tepi.

Due to the intrinsic resistance of the BLN, a voltage drop will develop over the BLN from the sinker to the region under the poly gates. This voltage drop will forward bias the emitter-base junction of the lateral PNP, thereby turning it on. The lateral PNP injects holes into the base of the vertical NPN. The NPN amplifies this base current. The collector current of the NPN is flowing vertically. Hence a positive feedback mechanism is present. As a result the structure latches to a low voltage. This voltage is roughly equal to 2 times a forward diode voltage drop (the base of the PNP and NPN are flooded with majority carriers with a density higher than the doping concentrations of the collector junctions). The turn-on of the PNP is influenced by the BLN resistance (resistor R), which can be tuned by conventional means known to those skilled in the art.

The efficiency of the PNP is determined by its base width (parameter t). This base width has a lower limit due to the fact that the PNP should not go in punch-through at the operating voltage. Making t too large results in a low efficient PNP. When the efficiency of the PNP is too low, the structure doesn't latch anymore. The emitter of the PNP should be made highly doped (P+ and Pwell and Pfield) to make the efficiency high enough.

Concluding Remarks

The embodiments described can reduce the required size of the Gate Driven Power Transistor Device, e.g. DMOS transistor to reduce the area of semiconductor, e.g. silicon dedicated to the protection. It is possible to do so with a circuit that has two modes of operation:

Active mode (for the lower range of discharge currents)

Snapback mode (for the higher range of discharge currents), especially controlled snapback In the embodiments described, the qualities of the active clamp are combined with those of the snapback protection to create a hybrid clamp. As described above, when the amplitude of the discharge current becomes incompatible with the current carrying capacities of the channel of the Gate Driven Power Transistor Device, e.g. DMOS, the parasitic bipolar transistor or transistors associated with the Gate Driven Power Transistor Device, e.g. DMOS device are used in a controlled snapback to discharge the current to ground. Various embodiments have additional features such as a vertical VDMOS, controlling the snapback point by appropriate selection of Lacc and W, or controlling the snapback point by appropriate selection of Tepi. Further additional features include optimising the active clamp mode by appropriate BLN dose tuning, or providing an extra pnp transistor (Thyristor), or tuning of t and BLN dose. Other variations can be conceived within the scope of the claims.

The invention claimed is:

1. A circuit having a Gate Driven Power Transistor Device having a gate and being coupled to protect a line subject to transient overstress, the circuit having external circuitry coupled to the transistor device to provide an active clamp mode in which the gate of the transistor device is controlled to allow transient overstress current from the line through the transistor device, and the transistor device having a snapback mode in which one or more transistors conduct the current if the transient overstress exceeds a predetermined threshold;

wherein a threshold of the transistor device is set below a current capacity of a channel of the transistor device; and wherein the threshold is provided by selecting a distance between source regions of a transistor forming the transistor device.

2. The circuit of claim 1, the one or more transistors to conduct the current in transient overstress are parasitic transistors.

3. The circuit of claim 1, the transistor device being a vertical transistor.

4. The circuit of claim 3, the vertical transistor being a vertical DMOS transistor.

5. The circuit of claim 1, wherein the one or more transistors to conduct the current in transient overstress are bipolar transistors.

6. The circuit of claim 1, wherein the transistor device is a transistor provided with two or more source regions.

7. The circuit of claim 1, wherein the external circuitry includes a voltage limiting device.

8. The circuit of claim 7, wherein the voltage limiting device is a Zener diode or a Zener diode string or a high voltage avalanche diode coupled between the gate of the transistor device and a supply line, and a resistor coupled between the gate and a supply line.

9. The circuit of claim 1, a width of the transistor device being set to provide the desired threshold.

10. The circuit of claim 1, wherein a depth of a drain region of the transistor device below the gate is selected to provide the desired threshold.

11. The circuit of claim 1, wherein the transistor device has a highly doped buried layer.

12. The circuit of claim 11, wherein a resistivity of the buried layer is selected to reach an optimal balance between hot spot hopping and drain ballasting providing an enhanced current carrying capacity.

13. The circuit of claim 1, the transistor device comprising a first transistor of a first type and a second transistor of opposite type coupled in a thyristor configuration.

14. The circuit of claim 1, wherein the circuit is in the form of an integrated circuit.

15. A method of manufacturing a circuit having a Gate Driven Power Transistor Device coupled to protect a line subject to transient overstress, the method comprising:
   forming the Gate Driven Power Transistor Device having a gate and one or more transistors;
   forming external circuitry coupled to the transistor device so as to provide an active clamp mode in which the gate of the transistor device is controlled to allow transient overstress current from the line through the transistor device, and the transistor device having a snapback mode in which the one or more transistors conduct the current if the transient overstress exceeds a predetermined threshold; and
   setting a threshold of the transistor device below a current capacity of a channel of the transistor device;
   wherein setting the threshold includes setting a distance between source regions of a transistor forming the transistor device to provide the desired threshold.

16. The method of claim 15, the one or more transistors to conduct the current in transient overstress being formed as parasitic transistors.

17. The method of claim 15, the transistor device being formed as a vertical transistor.

18. The method of claim 17, the vertical transistor being a vertical DMOS transistor.

19. The method of claim 15, wherein the one or more transistors to conduct the current in transient overstress are formed as bipolar transistors.

20. The method of claim 15, wherein the transistor device is formed as a transistor provided with two or more source regions.

21. The method of claim 15, wherein the external circuitry is formed as a voltage limiting device coupled between the gate of the transistor device and a supply line, and a resistor coupled between the gate and a supply line.

22. The method of claim 15, wherein setting the threshold includes setting a width of the transistor device to provide the desired threshold.

23. The method of claim 15, wherein setting the threshold includes setting a depth of a drain region of the transistor device below the gate to provide the desired threshold.

24. The method of claim 15, further comprising forming a highly doped buried layer in the transistor device.

25. The method of claim 24, further comprising setting a resistivity of the buried layer to reach an optimal balance between hot spot hopping and drain ballasting.

26. The method of claim 15, further comprising forming the transistor device with a first transistor of a first type and a second transistor of opposite type coupled in a thyristor configuration.

27. The method of claim 26, wherein the first and second transistors are bipolar transistors.

* * * * *